(12) United States Patent
Colgan et al.

(10) Patent No.: US 6,346,175 B1
(45) Date of Patent: Feb. 12, 2002

(54) MODIFICATION OF IN-PLATE REFRACTORY METAL TEXTURE BY USE OF REFRACTORY METAL/NITRIDE LAYER

(75) Inventors: Evan George Colgan, Chestnut Ridge; James McKell Edwin Harper, Yorktown Heights, both of NY (US); Kenneth Parker Rodbell, Sandy Hook, CT (US); Hiroshi Takatsuji, Machida (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/425,672

(22) Filed: Oct. 22, 1999

Related U.S. Application Data

(63) Continuation-in-part of application No. 08/974,988, filed on Nov. 20, 1997, now abandoned.

(51) Int. Cl.$^7$ ................................................ C23C 14/34
(52) U.S. Cl. ............................ 204/192.15; 204/192.12
(58) Field of Search ...................... 204/192.12, 192.15, 204/192.17

(56) References Cited

U.S. PATENT DOCUMENTS 3,655,544 A 4/1972 Rairden, III (List continued on next page.)

OTHER PUBLICATIONS

O. P., Karpenko et al., "Growth Anisotropy and the Development of In–Plane Texture" University of Michigan, Feb. 5, 1997, pp. 1–19, Figures 1–10.

(List continued on next page.)

Primary Examiner—Nam Nguyen
Assistant Examiner—Gregg Cantelmo
(74) Attorney, Agent, or Firm—Connolly Bove Lodge & Hutz, LLP; Robert M. Trepp, Esq.

(57) ABSTRACT

A method for achieving, and a structure containing, a thin film refractory metal with a generally symmetric microstructual morphology. Incorporation of between 1 and 5% by atomic fraction nitrogen into the refractory metal selected from the group of Ti, V, Cr, Nb, Mo, Ta, W and alloys thereof results in the desired structural morphology and electrical resistance. Multi-layer structures can be built up of alternate layers of refractory metal with and without nitrogen to achieve a desired product. Alternate layers can vary in thickness and nitrogen content.

6 Claims, 8 Drawing Sheets

U.S. PATENT DOCUMENTS

| | | | |
|---|---|---|---|
| 3,847,658 A | | 11/1974 | Kumagai |
| 4,000,055 A | | 12/1976 | Kumagai |
| 4,846,949 A | | 7/1989 | Tu et al. |
| 4,976,839 A | | 12/1990 | Inoue |
| 5,150,233 A | * | 9/1992 | Enomoto et al. ............ 349/147 |
| 5,162,933 A | | 11/1992 | Kakuda et al. |
| 5,281,485 A | | 1/1994 | Colgan et al. |
| 5,342,426 A | | 8/1994 | Dumbaugh, Jr. |
| 5,358,615 A | | 10/1994 | Grant et al. |
| 5,421,975 A | | 6/1995 | Mahvan et al. |
| 5,427,666 A | | 6/1995 | Mueller et al. |
| 5,428,250 A | * | 6/1995 | Ikeda et al. .................... 257/59 |
| 5,455,197 A | | 10/1995 | Ghanbari et al. |
| 5,482,785 A | | 1/1996 | Mahvan et al. |
| 5,528,081 A | * | 6/1996 | Hall ........................... 257/768 |
| 5,587,330 A | * | 12/1996 | Yamasaki ................... 438/162 |
| 5,587,609 A | | 12/1996 | Murakami et al. |
| 5,654,207 A | | 8/1997 | Fukuyama et al. |
| 5,672,255 A | | 9/1997 | Hamada et al. |
| 5,719,410 A | * | 2/1998 | Suehiro et al. ............. 257/768 |
| 5,792,327 A | | 8/1998 | Belscher et al. |
| 5,808,715 A | * | 9/1998 | Tsai et al. ................... 349/122 |
| 5,821,622 A | | 10/1998 | Tsuji et al. |
| 5,831,694 A | * | 11/1998 | Onisawa et al. ............ 349/147 |
| 5,834,846 A | | 11/1998 | Shinriki et al. |
| 5,858,819 A | * | 1/1999 | Miyasaka ................... 438/149 |

OTHER PUBLICATIONS

Shin'ya Kominami et al., "Anisotropy in resistivity of MoNx films at 4.2 K" J. Vac. Sci. Technology vol. B 14(5), Sep./Oct. 1996 pp. 3395–3399.

D. W. Hoffman et al., Effects of substrate orientation and rotation on internal stresses in sputtered metal J. Vac. Sci Technol., vol. 16(2), Mar./Apr. 1979, pp. 134–137.

Lock See Yu et al., "Alignment of thin films by glancing angle ion bombardment during deposition" Appl. Phys. Lett., vol. 47(9), Nov. 1, 1985, pp. 932–933.

J.M.E. Harper et al., "In–Plane Crystallographic Texture Of BCC Metal Thin Films On Amorphous Substrates", IBM T.J. Watson Research Center, Spring 1997.

Y. Iijima et al., "In–plane aligned $YBa_2Cu_3O_{7-x}$ thin films deposited on polycrystalline metallic substrates" Appl. Phys. Lett., vol. 60(6), Feb. 10, 1992, pp. 769–770.

K. K. Shih et al., "Properties of W–N and Mo–N films prepared by reactive sputtering" J. Vac. Sci. Technol., vol. A8(3), May/Jun. 1990, pp. 1359–1363.

Kwang–Lung Lin et al., "Deposition and properties of Mo–N films", J. Vac. Sci. technol. A, vol. 13(6), Nov./Dec. 1995, pp. 2871–2876.

Y. Iijima et al., "In–Plane Texturing Control Of Y–Ba–Cu–O Thin Films On Polycrystalline Substrates By Ion–Beam–Modified Intermediate Buffer Layers" IEEE Transactions on Applied Superconductivity vol. 3(1), (1993) pp. 1510–1515.

O. P. Karpenko et al., "Combined transmission electron microscopy and x–ray study of the microstructure And texture in sputtered Mo films", J. Appl. Phys., vol. 76(8), Oct. 15, 1994, pp. 4610–4617.

J.M.E. Harper et al., "Control of in–plane texture of body centered cubic metal thin films", J. Appl. Phys. vol. 82(9), Nov. 1, 1997, pp. 4319–4326.

* cited by examiner

MODIFICATION OF IN-PLATE REFRACTORY METAL TEXTURE BY USE OF REFRACTORY METAL/NITRIDE LAYER

CROSS-REFERENCE TO RELATED APPLICATION

This application is a continuation-in-part of U.S. patent application Ser. No. 08/974,988 filed Nov. 20, 1997, now abandoned.

TECHNICAL FIELD

FIELD OF THE INVENTION

The present invention pertains to thin film devices and in particular thin film devices with layers exhibiting controlled microstructural morphology.

BACKGROUND OF THE INVENTION

In many thin film structures and devices, the metal thin film components have a microstructure which is not symmetrical. For example, the metal thin film may have a surface roughness which is asymmetrical, i.e. the roughness is higher when measured along one direction on the film surface and less rough when measured along an orthogonal direction. The roughness asymmetry may also cause processing problems, such as excessive chemical etching of the surface in a subsequent patterning process.

In another structure the individual crystals or grains, may be longer along one direction parallel to the film surface and shorter along the orthogonal direction. It is also possible that the crystal directions within the grains may be preferentially oriented along one direction parallel to the film surface referred to in the industry as a restricted fiber texture. Other examples include asymmetrical electrical properties, optical properties, magnetic properties, stress, or mechanical properties which may be linked to the occurrence of the asymmetrical conditions set out above.

The asymmetrical microstructure originates in the deposition of the thin film. For example, deposition at an angle to the substrate plane produces an asymmetrical microstructure in molybdenum. This is set forth in the paper titled "Combined Transmission Electron Microscopy and X-ray Study of the Microstructure and Texture in Sputtered Mo Films" by O. P. Karpenko, J. C. Bilello and S. M Yalisove, Journal of Applied Physics. 76,4610 (1994).

Deposition in the presence of non-normal incidence ion bombardment produces an asymmetrical microstructure as shown for niobium (Nb) by L. S. Yu, J. M. E. Harper, J. J. Cuomo and D. A. Smith in a publication entitled "Alignment of Thin Films by Glancing Angle Ion Bombardment During Deposition", Applied Physics, Lett. 47,932 (1985).

Deposition in magnetron sputtering systems which scan the substrate in a direction parallel to the target surface also produces an asymmetrical microstructure. This is shown for molybdenum (Mo) films by the authors in a paper titled "In-Plane Crystallographic Texture of bcc Metal Thin Films on Amorphous Substrates", the article is published Vol. 472, (1997) page 27, authored by J. M. E. Harper, K. P. Rodbell, E. G. Colgan and R. J. Hammond for a Proc.Mat.Res.Soc-.Symp.

In some applications, asymmetrical microstructure in a thin film is desirable, for example, when the properties are improved by having a strongly aligned crystallographic texture. An example of this is in a high temperature superconductor, where the critical current density is highest along a certain crystal direction, and therefore, it is desirable to have this orientation preferentially aligned in one direction along the sample surface. Additional discussions of thin film microstructures can be found in "Anisotropy in Resistivity of MoNx films at 4.2K" by S. Kominami, R. Mita and T. Nishino published in the Journal Vacuum Science Technology, B14, 3395 (1996); the "Effects Of Substrates Orientation And Rotation On Internal Stresses In Sputtered Metal Films" by D. W. Hoffmann and J. A. Thornton Journal Vacuum Science Technology 16,134 (1979); an article titled "In-Plane Texturing control of Y—Ba—Cu—O Thin Films on Polycrystalline Substrates by Ion-Beam—Modified Intermediate Buffer Layers, Applied superconductivity Conference Aug. 24–28 1992, Chicago, Ill. Published in IEEE Transactions on Applied Superconductivity 3(1) (1993) pp 1510–1515." by Y. Iijima, K. Onabe, N. Futaki, N. Sadakata, O. Kohno and Y. Ikeno, "Properties of W—N and Mo—N Films Prepared by Reactive Sputtering" by K. K. Shih and D. B. Dove, Journal Vacuum Science Technology, A8,1359 (1990) and an article by K. L. Lin and Y. J. Ho titled "Deposition and Properties of Mo—N Films" appearing in the Journal of Vacuum Science Technology, A13,2872 (1995).

For many applications, however, an asymmetrical microstructure in a thin film is undesirable and it is preferred to have a symmetrical microstructure and thus more uniform properties in the film.

U.S. Pat. Nos. 3,847,658; 4,000,055; 4,846,949; 5,162,933; 5,281,485; 5,421,975; 5,427,666; 5,455,197; and 5,482,785 disclose and discuss various thin film structures wherein nitrogen is incorporated into a refractory metal to impart selected properties to the film and/or the device.

SUMMARY OF THE INVENTION

The present invention pertains to a process for incorporating nitrogen and the resulting film structures achieved by incorporating nitrogen into a refractory metal to control the in-plane texture of the refractory metal layer. Incorporation of nitrogen into the refractory metal such as titanium, vanadium, chromium, niobium, molybdenum, tantalum, tungsten and alloys thereof results in a film with a microstructural morphology that is symmetrical in nature. In the context of the present invention symmetrical refers to measurements of microstructure showing substantial uniform intensity as a function of the azimuthal angle around the perpendicular to the plane of the surface. According to the present invention asymmetrical pole figure for the refractory metal/nitride film indicates that the ratio of highest to lowest intensities measured as a function of the azimuthal angle lie between 1:1 and 2:1 but no higher. Values higher than these ratios would indicate substantial azimuthal asymmetry.

According to the present invention metal thin films are preferably refractory metals consisting of one or more metals or alloys selected from the group consisting of titanium(Ti), vanadium(V), niobium(Nb), tantalum(Ta), chromium(Cr), molybdenum(Mo) and tungsten(W).

According to the present invention it has been discovered that incorporation of between 1 and 5 atomic percent nitrogen into a refractory metal thin film can overcome the asymmetric effects of the deposition environment and produce a symmetrical microstructure. The refractory metal film containing nitrogen and/or metal nitrides can be used as an underlayer, intermediate layer or in a bi-layer or multi-layer structure to obtain a symmetrical microstructure of the overall multi-layer structure.

According to the present invention refractory metals can be alloyed with other metals as long as the refractory nature of the film is maintained.

Thus in one aspect the present invention pertains to a method for modifying the microstructural morphology of a thin metal film by depositing a layer of refractory metal on a glass substrate in the presence of an inert gas to which is added an effective amount of nitrogen.

In another aspect the present invention pertains to a structure having a controlled microstructural morphology the structure being a substrate with a thin film layer comprising a refractory metal containing from 1 to 5% nitrogen by atomic fraction deposited in the substrate.

DETAILED DESCRIPTION OF THE INVENTION

The goal of the present invention is to provide a thin film structure containing one or more layers of metal thin films, in which the microstructure is symmetrical.

As used herein symmetrical refers to measurements of microstructure showing substantial uniform intensity as a function of the azimuthal angle around a perpendicular to the plane of the surface. For example, x-ray pole figure measurements show the distribution of orientation of grains relative to the plane of the surface. A symmetrical pole figure indicates that the ratio of the highest to the lowest intensities measured as a function of the azimuthal angle lies between 1:1 and 2:1 but no higher. Higher values indicate substantial azimuthal asymmetry.

According to the present invention a refractory metal thin film containing an effective amount of nitrogen to overcome the asymmetric effects of the deposition environment will produce a symmetrical microstructure. The nitrided refractory metal film can be used as an underlayer, an intermediate layer or a bi-layer or multi-layer structure, to obtain symmetrical or asymmetrical microstructures in symmetrical or multi-layer structures.

The metal thin films according to the present invention are preferably made of a refractory metal or a refractory metal alloy. The refractory metals are titanium, vanadium, niobium, tantalum, chromium, molybdenum and tungsten. For example, a refractory metal alloy can be made of molybdenum and tungsten with either metal being present in the other in the amount of between 0.01 and 99.99 weight percent. It is also possible to include other metals as alloys to the refractory metals. For example, aluminum can be alloyed with tantalum or cobalt with chromium. Furthermore, more complex alloys including ternary and quaternary alloys of widely varying compositions are included within the scope of the present invention.

Furthermore, alloys with a composition gradient either parallel to the plane of the film or perpendicular to the plane of the film are within the purview of the present invention.

According to the present invention a refractory metal thin film is deposited, for example, by a sputtering technique which is well known in the art. In a conventional sputtering process the metal is deposited using a carrier gas such as argon. In the method of the present invention nitrogen is introduced into the argon atmosphere in an amount so that the as-deposited film has a nitrogen content of from 1 to 5% by atomic fraction nitrogen. Nitrogen can be introduced into the argon atmosphere in the form of substantially pure nitrogen gas, or nitrous oxide. It is well known to incorporate oxygen into thin films for forming films with specific properties. In those instances where oxygen is also to be incorporated into the film nitrous oxide can be used as the source of nitrogen or pure nitrogen and pure oxygen can be introduced into the argon gas.

The amount of nitrogen required for incorporation into the metal thin film will depend upon deposition power, and configuration of the deposition system. All these parameters are well known to a worker skilled in the art.

The films according to the present invention may contain metal nitride compounds, mixed phases or nitrogen in solution with the metal. According to the present invention only that quantity of nitrogen that will produce a symmetrical microstructure need be incorporated into the film. It is not necessary to produce a metal nitride to achieve the effect of the present invention.

According to the invention it is possible to establish that one can control the in-plane orientation in Mo films by following two different avenues; (1) control the sputtering geometry and/or deposition conditions such that the desired texture is obtained or (2) control the initial refractory metal (e.g. Mo) seed layer by the above approach or by alloying with (for example) N2. The main thrust is that either one and in some cases both are required in order to obtain a uniform microstructure.

The present invention is not nitrided refractory metal, which is known in the prior art, but, the overall structure within which metal containing nitrogen forms a layer which produces an overall symmetrical microstructure. This can be accomplished in a variety of ways including alloying a seed layer with, for example, nitrogen or by controlling the deposition parameters as shown in the article by Harper et al. titled Control of in-plane texture of body centered cubic metal thin films, Journal of Applied Physics, 82(9) Nov. 1, 1997, the information set forth therein being incorporated herein by reference. Crystallographic texture is strongly influenced by energetic particle bombardment during film deposition. In sputtering the two main energetic species are the sputtered target atoms and atoms of the sputtering gas which have been reflected from the target surface. By varying the ratio and direction of this bombardment (e.g., by changing the gas partial pressure, applied bias, applied voltage, chamber geometry, etc.) it is possible to produce various symmetric and non-symmetric microstructures. In addition by carefully controlling the initial seed layer texture one can alter the crystallographic orientation of the subsequently deposited film. This can be done as listed above (dep parameters) and by alloying this seed layer in such a way as to produce a symmetrical microstructure which will then be passed on to the film deposited on top. Example 1: (No N or alloying used). Deposit a thin film in such a manner to obtain a symmetrical microstructure (in a single wafer sputtering system where the wafer rotates under a target during deposition). Then deposit the balance of the film on top of this thin seed layer.

Furthermore, according to the present invention a multi-layer film structure with symmetrical microstructure and low metallic resistivity may be formed. The term low resistivity will depend on the application, but for example includes a structure based on molybdenum (Mo) metal, where the microstructure is symmetrical and the overall resistivity is less than 100 micro-ohm-centimeter. The resistivity of pure molybdenum is 5 micro-ohm-cm, and the addition of nitrogen to produce a symmetrical microstructure results in an increased resistivity. By combining thin layers of nitrided molybdenum with alternating layers of pure molybdenum a symmetrical microstructure can be produced while maintaining low electrical resistivity as will hereinafter be more fully disclosed.

It is also possible to produce a multi-layer thin film structure containing nitride and refractory metal layers, with overall low resistivity as part of the conductor elements of a flat panel thin film transistor display system. Such a conductor element may be the gate conductor element or the data metal conductor element. In this application, the symmetrical microstructure permits a uniform smooth taper etch to be performed in patterning the conductor element. The smooth tapers are required for successful fabrication of the complete flat panel display.

Figure 1:
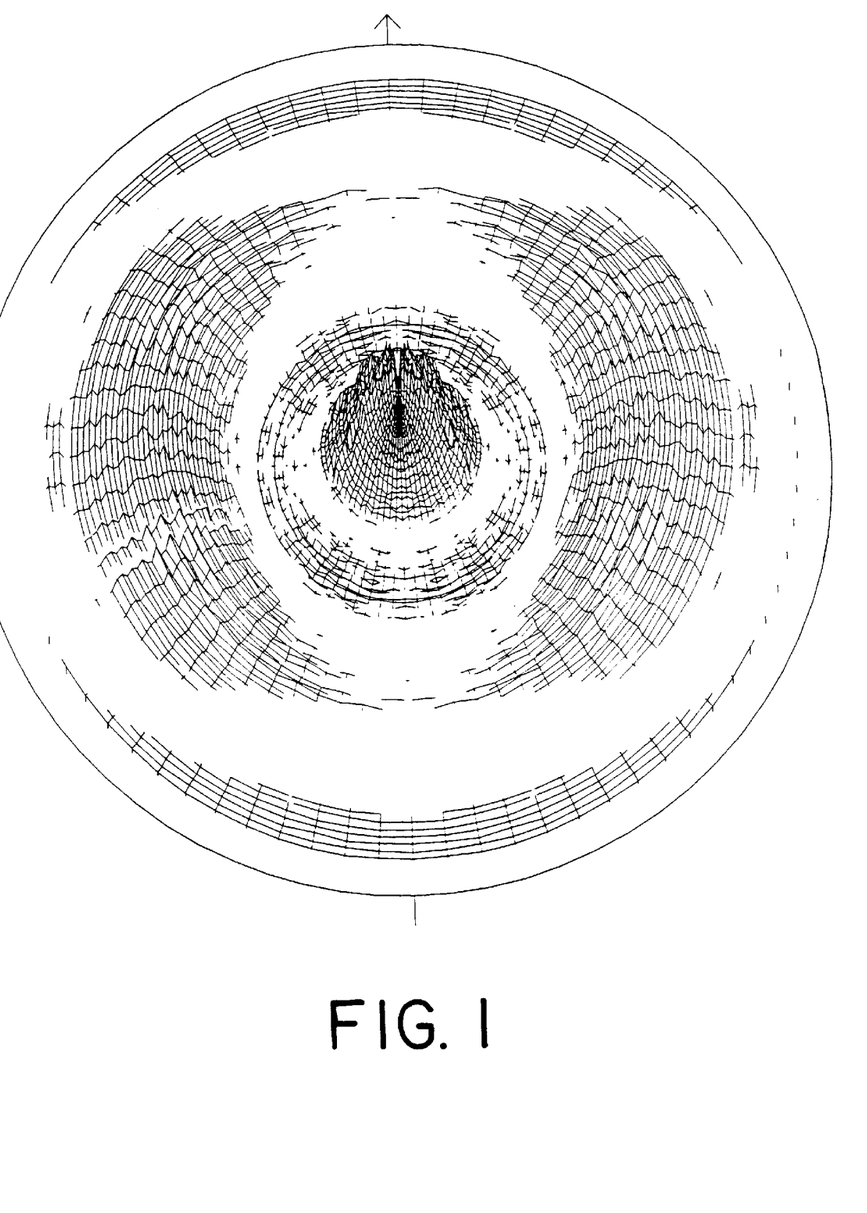
FIG. 1, is a pole figure for a layered pure molybdenum film structure.

Referring to the drawing, FIG. 1 is an asymmetrical (110) pole figure for a layered pure molybdenum film consisting of a 50 nm thick underlayment of pure molybdenum followed by a 100 nm thick pure molybdenum film layer. The asymmetry is clearly evident in the outer (110) ring where there is considerable intensity along both the right and left hand sides but almost no intensity on both the top and bottom portions of the outer ring. A completely symmetric (110) pole figure would exhibit full symmetry and would contain intensity both at the pole figure center and around the entire (110) ring, which is located 60 degrees from the pole center.

Figure 2:
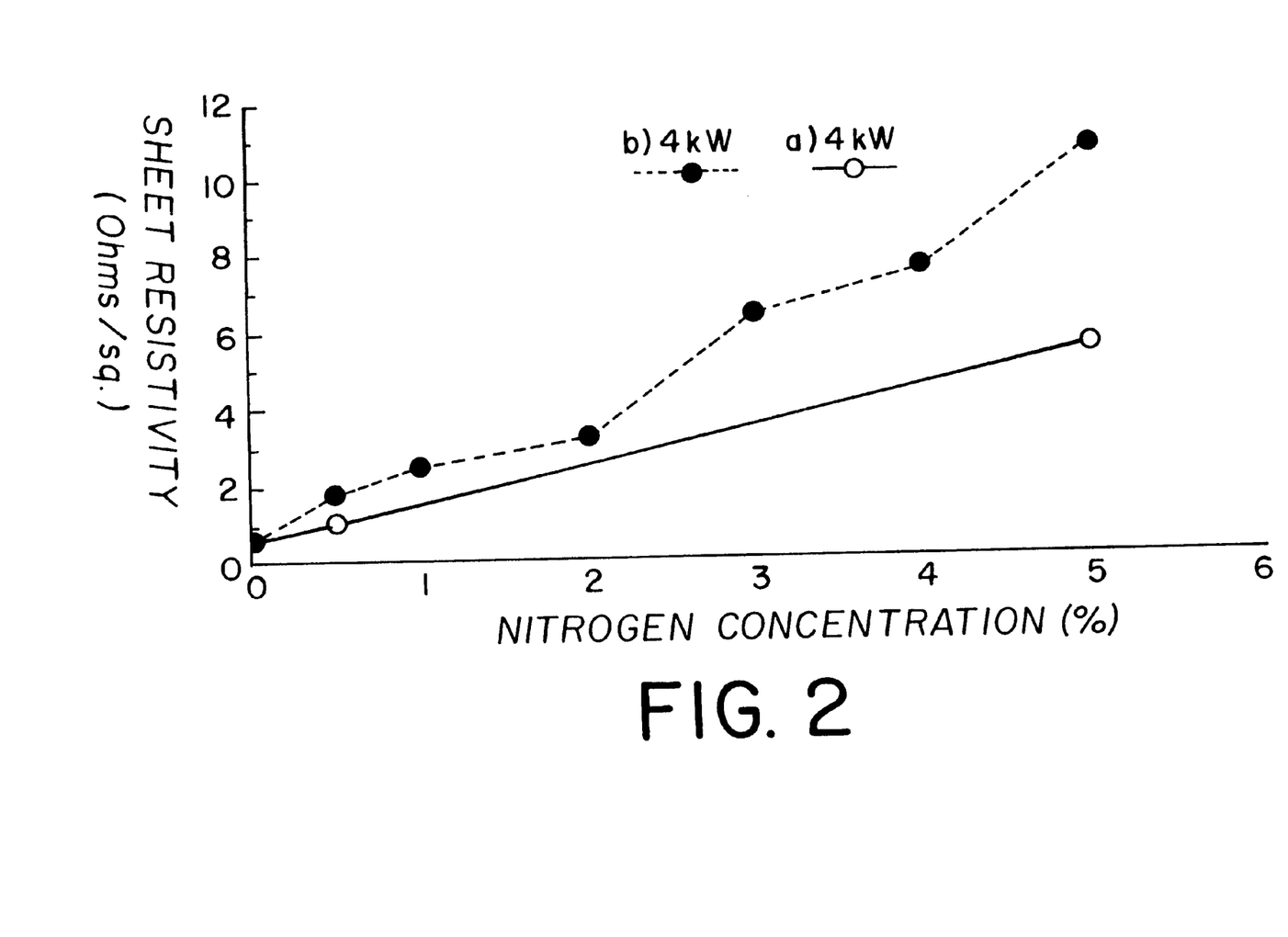
FIG. 2, is a plot of sheet resistivity against nitrogen concentration for sputtered Mo/nitrogen films on a glass substrate.

FIG. 2, is a plot of sheet resistivity against nitrogen content for a 250 nm thick molybdenum film deposited on a glass substrate. The plot of FIG. 2 shows that molybdenum films have a sheet resistivity that is a function of the nitrogen content. As the nitrogen content increases the sheet resistivity of the film increases.

Figure 3:
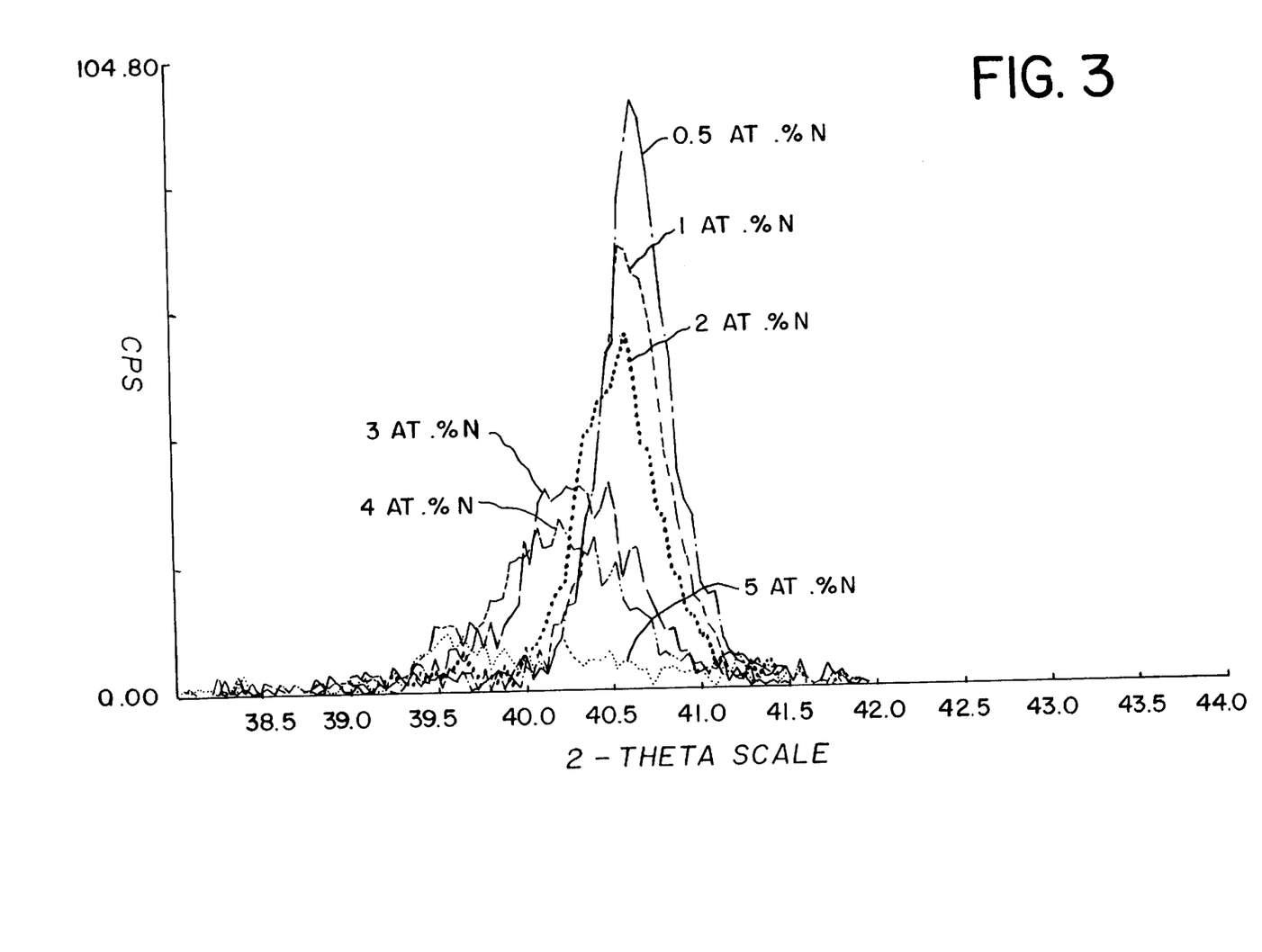
FIG. 3, is a plot of a Dragg-Brentano scan for a series of Mo films with differing nitrogen content.

FIG. 3, is a plot of intensity against 2θ, also known as a Bragg-Brentano scan for a series of molybdenum films with nitrogen content varying from 0.5 to 5 atomic percent nitrogen. The peaks shown at approximately 40.65° (2θ) correspond to the Mo (110) planes which are parallel to the glass substrate. As nitrogen is added to the film the strength of the (110) peak decreases. This implies that the Mo grains are becoming less ordered as a lesser fraction of (110) grains are present in the Mo films as the nitrogen content increases.

Figure 4A:
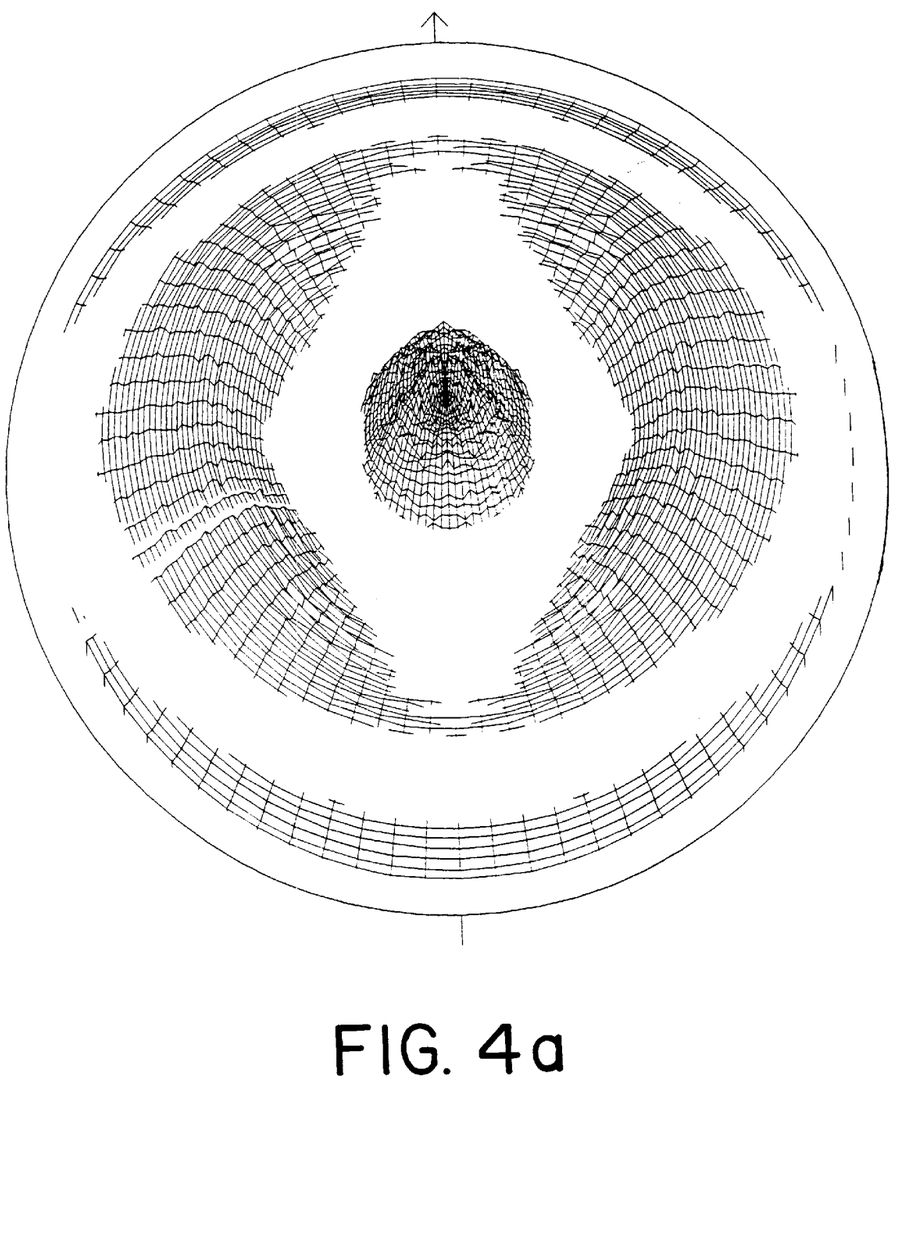
FIG. 4a, is a pole figure for a 250 nm Mo film containing 1 atomic percent nitrogen.

FIG. 4a is a (110) pole figure for a 250 nm Mo film containing 1 atomic percent nitrogen. The sheet resistivity of this film was 2.5 Ohms per square (62.5 micro-ohm-centimeter).

Figure 4B:
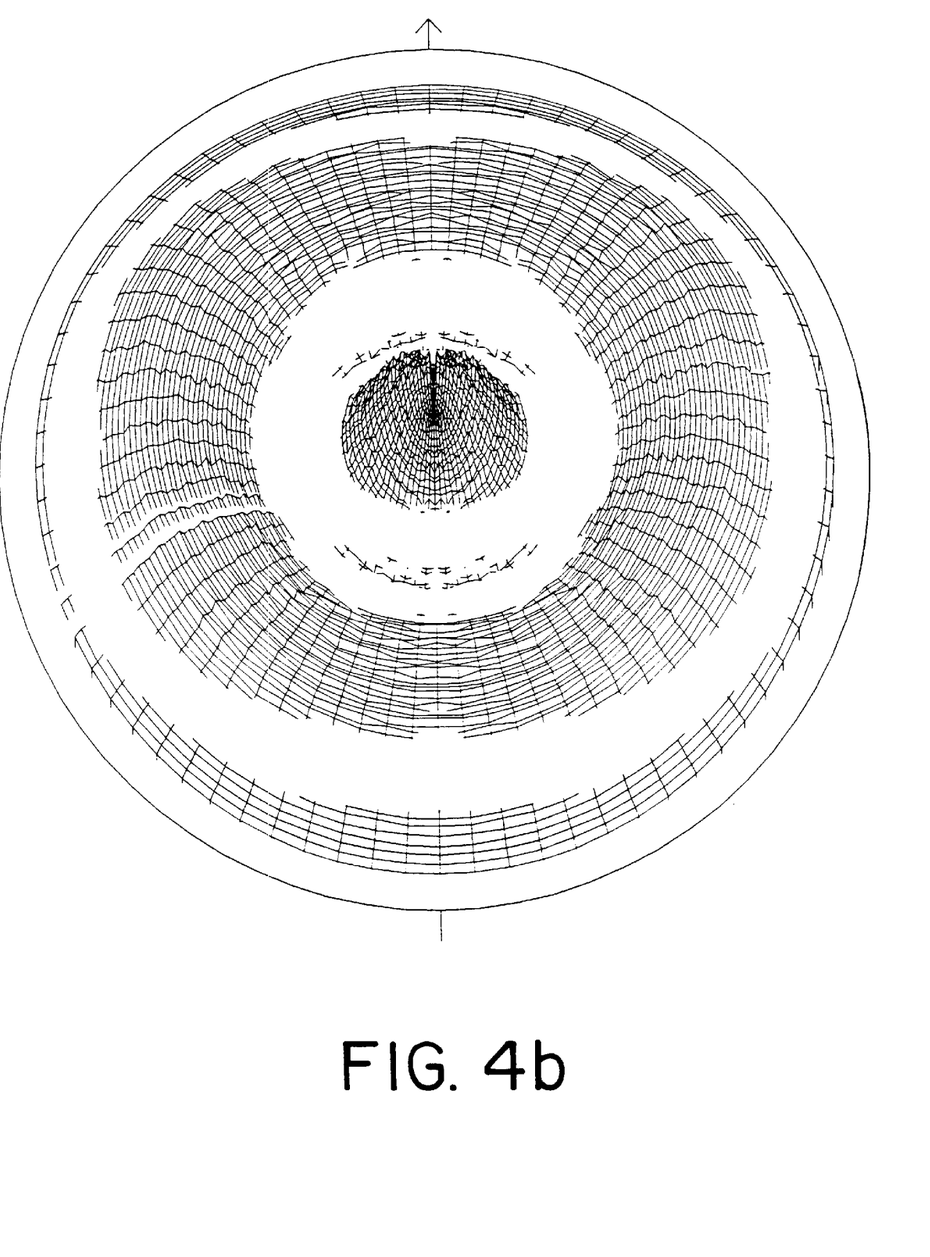
FIG. 4b, is a pole figure for a 250 nm Mo film containing 2 atomic percent nitrogen.

FIG. 4(b), is a (110) pole figure for a 250 nm molybdenum film containing 2 atomic percent nitrogen deposited on a glass substrate. The sheet resistivity of this film was 3.2 ohms per square (80 micro-ohm-cent).

Figure 4C:
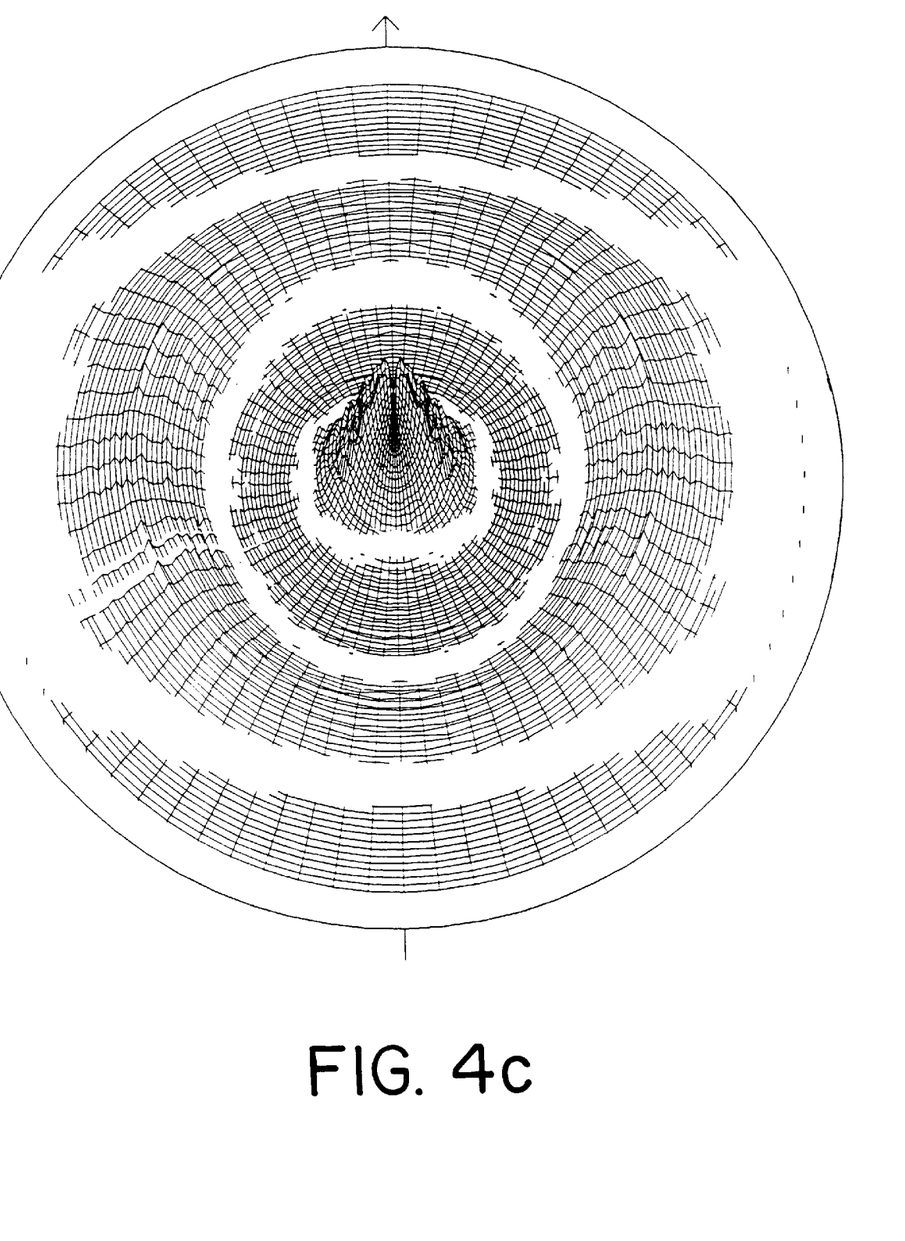
FIG. 4c, is a pole figure for a layered film consisting of a first layer of molybdenum(Mo) containing 1 atomic percent nitrogen 50 nm thick, a second layer of pure Mo 100 nm thick, a third layer 50 nm thick of Mo with 1 atomic percent nitrogen and a fourth layer 100 nm thick of pure Mo.

FIG. 4(c) is a (110) pole figure for a layered film consisting of a first layer 50 nm thick of molybdenum containing 1 atomic percent nitrogen, a second layer 100 nm thick of pure molybdenum, a third layer 50 nm thick of molybdenum containing 1 atomic percent nitrogen and a fourth layer of 100 nm thickness of pure molybdenum. The sheet resistivity of this film structure was 0.72 ohms per square (21.6 micro-ohm-centimeter). The results plotted in FIG. 4 show that asymmetric (110) texture in layered films can be produced with a limit in the increase in sheet resistivity by using thin molybdenum/nitride nitrogen layers instead of completely nitriding the molybdenum film.

Figure 5A:
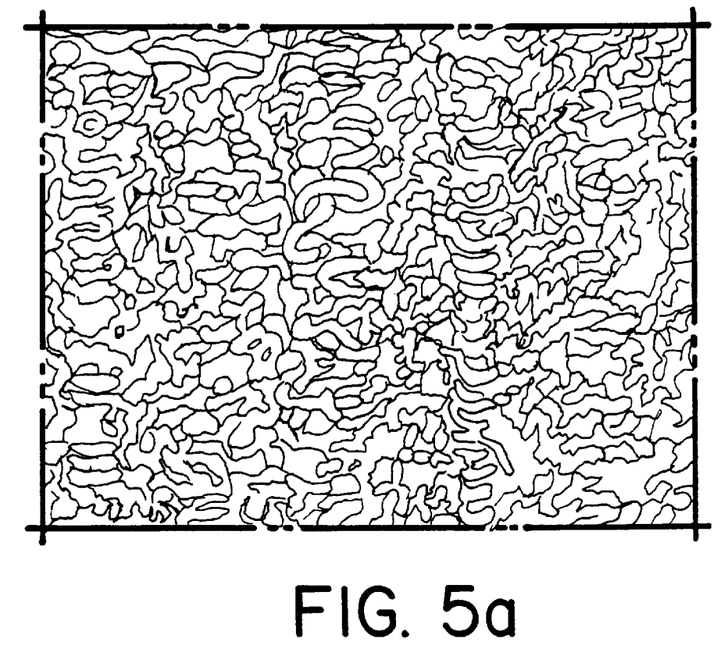
FIG. 5a, is a photograph of a scanning electron micrograph for a 250 nm Mo-0.5 atomic percent nitrogen film.
Figure 5B:
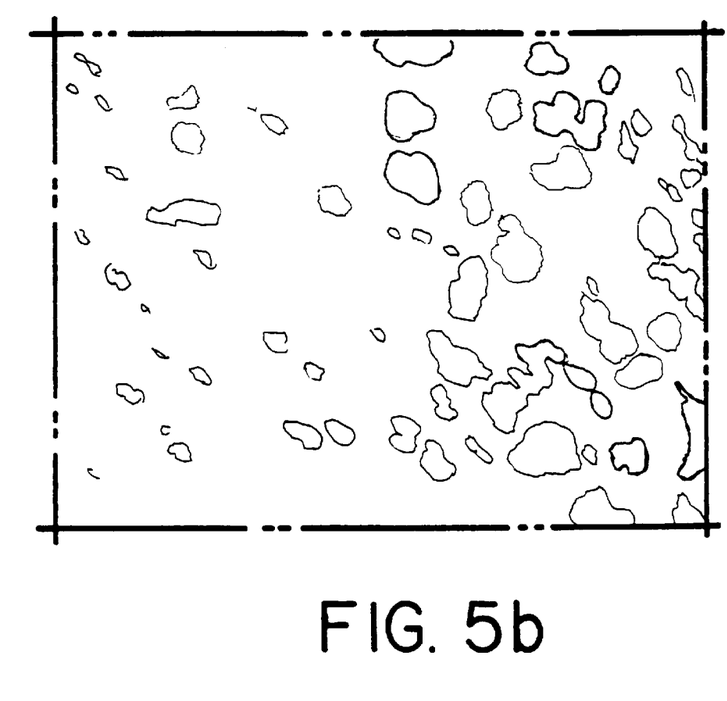
FIG. 5b, is a scanning electron micrograph of a Mo-5% nitrogen film.

FIG. 5(a), is a scanning electron microphotograph (SCM) of a 250 nm thick molybdenum film containing 0.5 atomic percent nitrogen showing the typical "rice grain morphology. This rice grain morphology leads to asymmetric (110) texture. FIG. 5(b), is a molybdenum-5 atomic percent nitrogen film showing a generally smooth surface morphology.

Figure 6A:
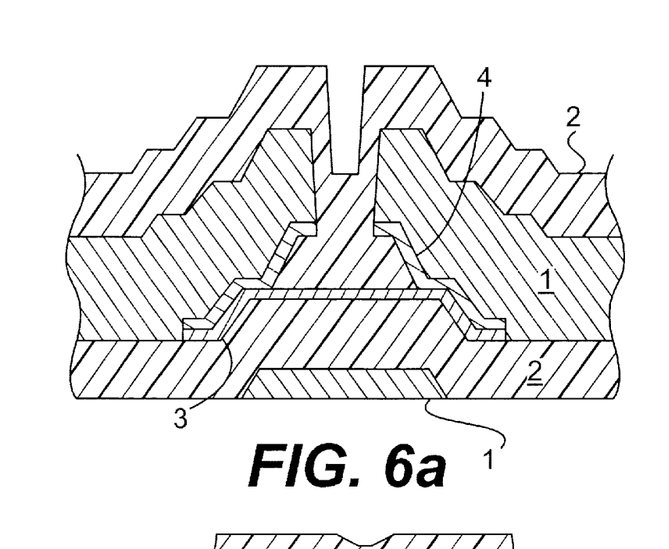
FIGS. 6a–6c are schematic cross-sections of typical thin film transistors (TFT's) showing the layered metal surfaces.
Figure 6B:
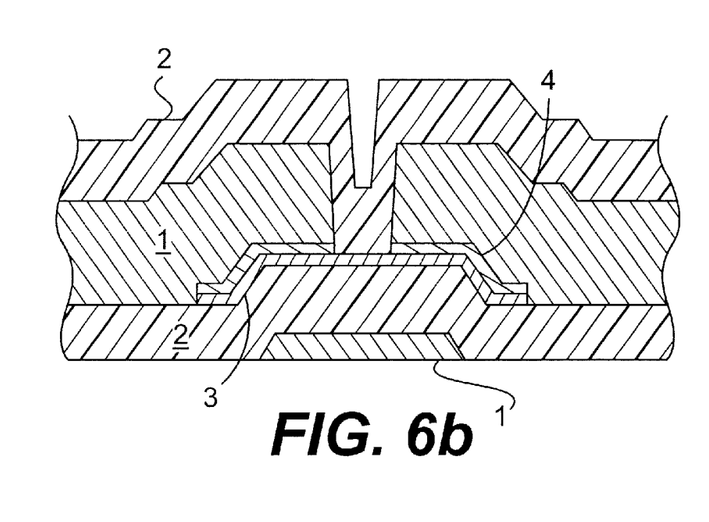
Figure 6C:
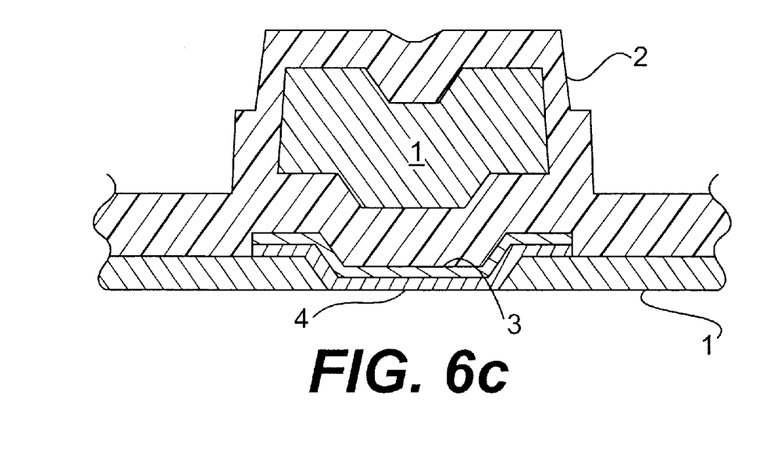

FIG. 6a is a schematic representation of the cross-section for a typical inverted-staggered trilayer thin film transistor (TFT) showing the layered metal surfaces. FIG. 6b is a schematic representation of the cross-section of an inverted-staggered back channel cut thin film transistor showing the layered metal surfaces. FIG. 6c is a schematic representation of a top gate-staggered thin film transistor showing the layered metal surfaces.

In FIGS. 6a–6c, numeral 1 represents a gate or data metal, numeral 2 represents gate or passivation dielectic, numeral 3 represents intrinsic α-Si:H and numeral 4 represents n+α-Si:H.

According to the present invention the preferred film composition contains 2 atomic percent or less nitrogen to control the in-plane texture while at the same time preventing a large increase in the sheet resistivity of the film.

It is known to deposit A 300 mm film of molybdenum which is used as a gate conductor in a display device. According to current technology the film is deposited by sputtering. It takes approximately 10 passes to grow the 300 nm molybdenum in a magnet scan ULVAC System. The deposition rate is high and very non-uniform as plasma travels back and forth across the glass substrate for example Corning 7059 Barium borosilicate glass or Corning 1737 alkaline earth-alumina-silica glass. This leads to etching away of some of the (110) Molybdenum planes resulting in a non-uniform (anisotropic) molybdenum film. According to the present invention deposition of a thin layer of molybdenum containing nitrogen (on the order of 15 nm) followed by deposition of a thicker molybdenum layer yields a more uniform (isotropic) film texture, which leads to more uniform dry etching.

The present invention has been illustrated by way of deposition of molybdenum films containing nitrogen. However, as stated above any of the conventional refractory metals may be used in place of molybdenum. It is also possible to use alloys of refractory metals or alloys of other metals with the refractory metals. Techniques for varying the composition are well known to workers skilled in the art.

Although illustrated and described herein with reference to certain specific embodiments, the present invention is nevertheless not intended to be limited to the details shown. Further, various modifications may be made in the details within the scope of the invention as defined in the following claims.

What is claimed:

1. A method for making a sputtered refractory metal film having a symmetrical microstructural morphology in a sputtering system which deposits a plurality of thin layers comprising the steps of:
    depositing a first layer of molybdenum on a substrate in the presence of an inert gas to which is added nitrogen; wherein the amount of nitrogen yields a layer of molybdenum containing from 1–5% nitrogen by atomic fraction;
    depositing a second layer of pure molybdenum or alloy thereof on said first layer where the first layer causes a symmetrical microstructural morphology to result for the second layers;
    depositing a third layer identical to said first layer on said second layer and a forth layer on said third layer identical to said second layer.

2. A method according to claim 1 including forming alternate layers of molybdenum containing nitrogen and pure molybdenum until a film of desired thickness is achieved.

3. A method according to claim 1 including the step of selecting a refractory metal from the group consisting of tungsten, tantalum and titanium to be alloyed with said molybdenum in one of said first layer, said second layer or both layers.

4. A method according to claim 1 including adding said nitrogen gas in an amount to yield a molybdenum layer containing 2% nitrogen by atomic fraction.

5. A method according to claim 1 wherein the resistivity of the plurality layers is less than 100 micro-ohm-centimeter.

6. A method according to claim 1 including selecting said substrate from the group consisting of barium boroaluminasilicate glass and alkaline earth-alumina silica glass.

* * * * *